(12) United States Patent
Lee et al.

(10) Patent No.: US 9,504,194 B2
(45) Date of Patent: *Nov. 22, 2016

(54) MAGNETIC FIELD SHIELDING SHEET FOR A WIRELESS CHARGER, METHOD FOR MANUFACTURING SAME, AND RECEIVING APPARATUS FOR A WIRELESS CHARGER USING THE SHEET

(71) Applicant: AMOSENSE CO., LTD., Cheonan-si, Chungcheongnam-do (KR)

(72) Inventors: Dong Hoon Lee, Yongin-si (KR); Kil Jae Jang, Seoul (KR)

(73) Assignee: AMOSENSE CO., LTD., Cheonan-Si (KR)

( * ) Notice: Subject to any disclaimer, the term of this patent is extended or adjusted under 35 U.S.C. 154(b) by 2 days.

This patent is subject to a terminal disclaimer.

(21) Appl. No.: 14/952,812

(22) Filed: Nov. 25, 2015

(65) Prior Publication Data

US 2016/0081237 A1 Mar. 17, 2016

Related U.S. Application Data

(63) Continuation of application No. 14/366,439, filed as application No. PCT/KR2012/011256 on Dec. 21, 2012, now Pat. No. 9,252,611.

(30) Foreign Application Priority Data

Dec. 21, 2011 (KR) ........................ 10-2011-0138987

(51) Int. Cl.
| | | |
|---|---|---|
| H01M 10/46 | (2006.01) | |
| H05K 9/00 | (2006.01) | |
| H01F 38/14 | (2006.01) | |
| H01F 27/36 | (2006.01) | |
| B32B 37/12 | (2006.01) | |
| B32B 37/18 | (2006.01) | |
| B32B 38/00 | (2006.01) | |
| H02J 7/00 | (2006.01) | |
| H02J 7/02 | (2016.01) | |
| H02J 5/00 | (2016.01) | |
| H04B 5/00 | (2006.01) | |
| H01Q 7/08 | (2006.01) | |
| H01Q 7/06 | (2006.01) | |

(52) U.S. Cl.
CPC ............ *H05K 9/0075* (2013.01); *B32B 37/12* (2013.01); *B32B 37/18* (2013.01); *B32B 38/0004* (2013.01); *H01F 27/365* (2013.01); *H01F 38/14* (2013.01); *H01Q 7/06* (2013.01); *H01Q 7/08* (2013.01); *H02J 5/005* (2013.01); *H02J 7/0042* (2013.01); *H02J 7/0052* (2013.01); *H02J 7/025* (2013.01); *H04B 5/0037* (2013.01); *H05K 9/0081* (2013.01); *H05K 9/0088* (2013.01); *Y10T 156/10* (2015.01); *Y10T 428/249955* (2015.04); *Y10T 428/249956* (2015.04); *Y10T 428/25* (2015.01); *Y10T 428/2848* (2015.01)

(58) Field of Classification Search
CPC .......... H02J 5/005; H02J 7/025; H02J 7/0042; H02J 7/355; H01F 27/362; H01F 27/365
USPC ..... 320/107, 108, 114, 115; 336/84 R, 84 C; 307/9.1, 104
See application file for complete search history.

(56) References Cited

U.S. PATENT DOCUMENTS

| | | |
|---|---|---|
| 4,774,148 A | 9/1988 | Goto |
| 5,097,373 A | 3/1992 | Yuki |
| 5,227,727 A | 7/1993 | Segawa et al. |
| 5,680,046 A | 10/1997 | Frederick et al. |
| 2012/0153732 A1* | 6/2012 | Kurs ...................... B60L 3/0069 307/104 |
| 2012/0248886 A1* | 10/2012 | Kesler ...................... H03H 7/40 307/104 |
| 2012/0256494 A1* | 10/2012 | Kesler ...................... H03H 7/40 307/104 |

FOREIGN PATENT DOCUMENTS

| | | |
|---|---|---|
| JP | 2006269536 | 10/2006 |
| KR | 1020030013831 | 2/2003 |
| KR | 1020030051394 | 6/2003 |
| KR | 1020030086122 | 11/2003 |
| KR | 1020100031139 | 3/2010 |
| KR | 101399024 | 5/2014 |

OTHER PUBLICATIONS

International Search Report—PCT/KR2012/011256 dated Mar. 18, 2013.

* cited by examiner

*Primary Examiner* — Edward Tso
(74) *Attorney, Agent, or Firm* — Maschoff Brennan

(57) ABSTRACT

Provided are a magnetic field shield sheet for a wireless charger, a method of manufacturing the sheet, and a receiver for the wireless charger by using the sheet. The sheet includes at least one layer thin magnetic sheet made of an amorphous ribbon separated into a plurality of fine pieces; a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, wherein gaps among the plurality of fine pieces are filled by some parts of the first and second adhesive layers, to thereby isolate the plurality of fine pieces.

11 Claims, 11 Drawing Sheets

MAGNETIC FIELD SHIELDING SHEET FOR A WIRELESS CHARGER, METHOD FOR MANUFACTURING SAME, AND RECEIVING APPARATUS FOR A WIRELESS CHARGER USING THE SHEET

CROSS-REFERENCE TO RELATED APPLICATIONS

This application is a continuation of U.S. patent application Ser. No. 14/366,439, which is the U.S. national stage of International Application No. PCT/KR2012/011256, filed Dec. 21, 2012, which claims priority to Korean Patent Application No. 10-2011-0138987, filed Dec. 21, 2011. The foregoing applications are incorporated herein by reference.

TECHNICAL FIELD

The present invention relates to a magnetic field shield sheet for a wireless charger, a method of manufacturing the magnetic field shield sheet, and a receiver for the wireless charger by using the magnetic field shield sheet, and more particularly to, a magnetic field shield sheet for a wireless charger, which blocks an effect of an alternating-current magnetic field generated when a charger function for a portable mobile terminal device is implemented in a non-contact wireless manner on a main body of the portable mobile terminal device and exhibits excellent electric power transmission efficiency, a method of manufacturing the magnetic field shield sheet, and a receiver for the wireless charger by using the magnetic field shield sheet.

BACKGROUND ART

As methods of charging secondary batteries mounted in electronic equipment such as portable terminals and video cameras, there are two types of charging methods, i.e., a contact type charging method and a non-contact type charging method. The contact type charging method carries out a charging operation by making an electrode of a power reception device in direct contact with an electrode of a power feeding device.

The contact type charging method is commonly used in a wide range of applications, since a structure of a device implementing the contact type charging method is simple. However, in association with miniaturization and weight reduction of electronic equipment, various electronic devices become light in the weight thereof, and accordingly a low contact pressure between electrodes of the power reception device and the power feeding device may cause problems such as charge failure charge error. Further, secondary batteries are weak at heat, which needs to prevent the temperature rise of the batteries, and to pay attention to a circuit design so as not to cause overcharge and overdischarge. To cope with these problems, a non-contact type charging method is being considered in recent years.

The non-contact type charging method is a charging method using an electromagnetic induction principle in which coils are mounted at both sides of the power reception device and the power feeding device.

A non-contact type charger can be miniaturized by putting a ferrite core to be in a magnetic core and winding coils around the ferrite core. Furthermore, for miniaturization and reduction in thickness, a technique of forming a resin substrate by mixing ferrite powder and amorphous powder and mounting a coil and the like on the resin substrate, has been proposed. However, in the case that a ferrite sheet is processed thinly, the thinly processed ferrite sheet may be easily broken and weak in impact resistance. As a result, there have been problems that defects have occurred in the power reception device due to a fall or collision of the non-contact type charger.

Further, in order to reduce thickness of a power reception portion of an electronic device in response to reduction in the thickness of the electronic device, a planar coil that is formed by printing a metal powder paste as a coil have been employed. A structure of strengthening a coupling of a planar coil and a magnetic sheet has been proposed. In the proposed structure, a magnetic body or a magnetic sheet is used as a core material to strengthen the coupling between primary and secondary coils.

Meanwhile, if a power transmission speed increases, defects between adjacent transformers, as well as defects caused by heat from the surrounding components, may be likely to occur. That is, in the case that the planar coils are used, the magnetic flux passing through the planar coils is connected to a substrate or the like inside an electronic device, an internal portion of the electronic device may be heated due to eddy currents caused by electromagnetic induction. As a result, large power cannot be transmitted and thus a time-consuming problem may be caused for charging the electronic device.

To cope with this problem, a magnetic body or a magnetic sheet was used as a shielding member on the back of the substrate. In order to obtain a sufficient shielding effect, as the magnetic body or the magnetic sheet may have the larger magnetic permeability, and the larger area and thickness, a more effective shielding effect can be obtained.

In general, a magnetic body such as an amorphous ribbon, a ferrite sheet, or a polymer sheet containing magnetic powder is used as the magnetic field shield sheet. An effect of focusing a magnetic field for improving magnetic field shielding performance and additional features may be good in the order of amorphous ribbons, a ferrite sheet, and a polymer sheet containing magnetic powder, with high magnetic permeability.

In the case of a power reception device of a conventional non-contact type charging system, a magnetic body or a magnetic sheet with high magnetic permeability and large volume is disposed on the opposite surface to a primary coil side, i.e., on the surface of a secondary coil, for reinforcement of a coupling for improving transmission efficiency, and for improving a shielding performance for suppression of heat generation. According to this arrangement, fluctuations in the inductance of the primary coil become large, and an operation condition of a resonant circuit is shifted from a resonance condition at which a sufficient effect can be exhibited according to a relative positional relationship between the magnetic body and the primary coil.

Korean Patent Application Publication No. 10-2010-31139 provides a power reception device for improving a resonance performance and also suppressing heat generation to solve the aforementioned problems, and proposes a technique of enabling large transmission power and shortening charge time, through an the electronic device and a power reception system using the power reception device.

In other words, according to Korean Patent Application Publication No. 10-2010-31139, a composite magnetic body including a plurality of magnetic sheets magnetic ribbons are arranged at at least one location between a spiral coil a power reception-side spiral coil: a secondary coil and a secondary battery, and between a rectifier and the spiral coil, to thereby prevent a magnetic flux generated from the power reception-side spiral coil from interlinking a circuit board and a secondary battery, and to thereby suppress noise and heat generation caused by an induced electromotive force electromagnetic induction, and the amount of fluctuation of inductance in the primary coil is controlled due to presence or absence of the secondary coil to thus enhance a resonance performance of a resonant circuit constituted by the primary coil and to thereby effectively control oscillation.

The composite magnetic body is set so that first magnetoresistance of a first magnetic sheet adjacent to the spiral coil is less than or equal to 60, second magnetoresistance of a second magnetic sheet laminated on the first magnetic sheet is greater than or equal to 100, and a value of the second magnetoresistance divided by the first magnetoresistance is equal to or greater than 1.0.

The first magnetic sheet is prepared by bonding polycarbonate resins on both surfaces of a first amorphous ribbon by using adhesive layers, respectively, and the second magnetic sheet is prepared by bonding polycarbonate resins on both surfaces of a second amorphous ribbon with large relative permeability by using adhesive layers, respectively. Then, the first magnetic sheet and the second magnetic sheet are integrally bonded via an adhesive layer.

Meanwhile, the ferrite sheet or a polymer sheet containing magnetic powder has the magnetic permeability a little lower than the amorphous ribbon, and thus in order to improve the performance of such low magnetic permeability, thickness of the ferrite sheet or a polymer sheet becomes large compared to the thin amorphous ribbon of several tens μm. Therefore, it is difficult to respond to a thinning tendency of terminals.

Further, in the case of amorphous ribbon with high magnetic permeability, the ribbon itself is a metal thin plate, and thus there is no burden on thickness of the amorphous ribbon.

However, when an alternating-current magnetic field according to frequency of 100 kHz used for power transmission is applied to the amorphous ribbon, functionality of applications may be reduced due to an influence of eddy currents of the ribbon surface, or problems of reducing wireless charging efficiency and causing heat generation may occur.

Co-based or Fe-based amorphous ribbons can increase surface resistance slightly, through heat treatment. However, in the case that a processing treatment such as a flake treatment process of reducing a surface area of the ribbon is performed in order to further reduce the eddy current effects, the magnetic permeability is significantly degraded and the function as the shield sheet is greatly degraded.

Also, most of wireless chargers employ a structure of adopting permanent magnets that assist an alignment with a power receiver in a power transmitter for power transmission, in order to increase the power transfer efficiency of the chargers to the maximum. A magnetization or saturation phenomenon occurs in a thin shield sheet due to a direct-current magnetic field of the permanent magnets, to thereby decrease the performance of the chargers or sharply decreasing the power transmission efficiency.

Accordingly, in the case of the conventional chargers, the thickness of the shield sheet must be quite thick in the order of 0.5T or higher, in order to indicate shielding features without being affected by the permanent magnets, and to maintain high power transmission efficiency, which may cause a major obstacle on slimming of portable terminals.

A voltage induced in a secondary coil of a wireless charger is determined by the Faraday's law and the Lenz's law, and thus it is more advantageous to have the greater amount of magnetic flux linked with the secondary coil in order to obtain a high voltage signal. The amount of the magnetic flux becomes large as the amount of a soft magnetic material contained in the secondary coil becomes large and the magnetic permeability of the material becomes high. In particular, since the wireless chargers essentially employ a non-contact power transmission system, a magnetic field shield sheet in which the secondary coil is mounted is needed to be made of a magnetic material with high permeability, in order to focus wireless electromagnetic waves made from the primary coil of a power transmission device, on the secondary coil of a power reception device.

Conventional magnetic field shield sheets for wireless chargers do not present solutions for attaining the thin film but solving the heat generation problem due to shields and improving the wireless charging efficiency. Thus, the present inventors recognized that inductance (magnetic permeability) is less reduced and magnetoresistance is greatly reduced, although an amorphous ribbon undergoes flakes in the case of the amorphous ribbon, and thus a quality factor (Q) of the secondary coil is increased, to thereby reach the present invention.

DISCLOSURE

Technical Problem

To solve the above problems or defects, it is an object of the present invention to provide a magnetic field shield sheet for a wireless charger, which greatly reduces a loss due to eddy currents by a flake treatment process of an amorphous ribbon, to thereby block an effect of a magnetic field influencing upon a main body and a battery of a portable mobile terminal device and simultaneously to increase a quality factor (Q) of a secondary coil, and to thus exhibit excellent electric power transmission efficiency, a method of manufacturing the magnetic field shield sheet, and a receiver for the wireless charger by using the magnetic field shield sheet.

It is another object of the present invention to provide a magnetic field shield sheet for a wireless charger, which fills a gap between fine pieces of an amorphous ribbon through a flake treatment process of the amorphous ribbon and then a compression laminating process with an adhesive, to thereby prevent water penetration, and which simultaneously surrounds all surfaces of the fine pieces with an adhesive (or a dielectric) to thus mutually isolate the fine pieces to thereby promote reduction of eddy currents and prevent shielding performance from falling, and a manufacturing method thereof.

It is still another object of the present invention to provide a magnetic field shield sheet for a wireless charger, which establishes a shape of a shield sheet into a shape similar to that of a secondary coil of a receiving device for a wireless charger, to thereby exhibit high power transmission efficiency even though a small number of nano crystalline ribbons are used, and a power reception device using the magnetic field shield sheet.

It is yet another object of the present invention to provide a magnetic field shield sheet for a wireless charger, which sequentially performs a flake treatment process and a laminating process by using a roll-to-roll method, to thereby achieve a sheet molding process to thus maintain original thickness of the sheet and to thus exhibit high productivity and inexpensive manufacturing costs.

Technical Solution

To accomplish the above and other objects of the present invention, according to an aspect of the present invention, there is provided a magnetic field shield sheet for a wireless charger, the magnetic field shield sheet comprising:

at least one layer thin magnetic sheet made of an amorphous ribbon separated into a plurality of fine pieces;

a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, wherein gaps among the plurality of fine pieces are filled by some parts of the first and second adhesive layers, to thereby isolate the plurality of fine pieces.

According to another aspect of the present invention, there is provided a method of manufacturing a magnetic field shield sheet for a wireless charger, the method comprising the steps of:

adhering a protective film and a double-sided tape formed of a release film on an exposed surface of the double-sided tape, on both sides of at least one layer thin magnetic sheet made of an amorphous ribbon, to thereby form a laminate sheet;

performing a flake treatment process of the laminate sheet to thus separate the thin magnetic sheet into a plurality of fine pieces; and laminating the flake treated laminate sheet, to thus fill some parts of first and second adhesive layers provided in the protective film and the double-sided tape into gaps among the plurality of fine pieces, a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, together with flattening and thinning of the laminate sheet, and to thereby isolate the plurality of fine pieces.

According to still another aspect of the present invention, there is provided a reception device for a wireless charger that charges a secondary battery by an electromagnetic induction method from a transmission device for the wireless charger, the reception device comprising:

a secondary coil that receives a wireless high frequency signal transmitted by the electromagnetic induction method from the transmission device; and a magnetic field shield sheet that is disposed between the secondary coil and the secondary battery, and that shields a magnetic field generated by the wireless high frequency signal and simultaneously induces the secondary coil to absorb the wireless high frequency signal necessary to perform a wireless charging function, wherein the magnetic field shield sheet comprises:

at least one layer thin magnetic sheet made of an amorphous ribbon separated into a plurality of fine pieces;

a protective film that is adhered on one surface of the thin magnetic sheet via a first adhesive layer provided on one side of the protective film; and a double-sided tape that is adhered on the other surface of the thin magnetic sheet via a second adhesive layer provided on one side of the double-sided adhesive tape, wherein gaps among the plurality of fine pieces are filled by some parts of the first and second adhesive layers, to thereby isolate the plurality of fine pieces.

Advantageous Effects

As described above, the present invention provides a magnetic field shield sheet for a wireless charger, which greatly reduces a loss due to eddy currents by a flake treatment process of an amorphous ribbon, to thereby block an effect of a magnetic field influencing upon a main body and a battery of a portable mobile terminal device and simultaneously to increase a quality factor (Q) of a secondary coil, and to thus exhibit excellent electric power transmission efficiency, a method of manufacturing the magnetic field shield sheet, and a receiver for the wireless charger by using the magnetic field shield sheet.

In addition, the present invention provides a magnetic field shield sheet for a wireless charger, which fills a gap between fine pieces of an amorphous ribbon through a flake treatment process of the amorphous ribbon and then a compression laminating process with an adhesive, to thereby prevent water penetration, and which simultaneously surrounds all surfaces of the fine pieces with an adhesive (or a dielectric) to thus mutually isolate the fine pieces to thereby promote reduction of eddy currents and prevent shielding performance from falling, and a manufacturing method thereof. As a result, all surfaces of the fine pieces are surrounded by an adhesive (or a dielectric material) to thereby prevent water from penetrating into the amorphous ribbon and to thus prevent the amorphous ribbon from being oxidized and changes in appearance and characteristics from being deteriorated.

Moreover, the present invention provides a magnetic field shield sheet for a wireless charger, which establishes a shape of a shield sheet into a shape similar to that of a coil of a receiving device for a wireless charger, to thereby exhibit a high power transmission efficiency or equal power transmission efficiency while lowering thickness of the magnetic field shield sheet to be equal to or less than 0.3 mm, even though a small number of nanocrystalline ribbons are used, and a power reception device using the magnetic field shield sheet.

In addition, the present invention provides a magnetic field shield sheet for a wireless charger, which sequentially performs a flake treatment process and a laminating process by using a roll-to-roll method, to thereby achieve a sheet molding process to thus maintain original thickness of the sheet and to thus exhibit high productivity and inexpensive manufacturing costs.

BEST MODE

The above and other objects, features, and advantages of the present invention can be appreciated by the following description and will be understood more clearly by embodiment of the present invention. In addition, it will be appreciated that the objects and advantages of the present invention will be easily realized by means shown in the appended patent claims, and combinations thereof. Accordingly, the technical spirit of the present invention can be easily implemented by one of ordinary skill in the art.

Further, if it is determined that the detailed description of the known art related to the present invention makes the gist of the present invention unnecessarily obscure, a detailed description thereof will be omitted.

Figure 1:
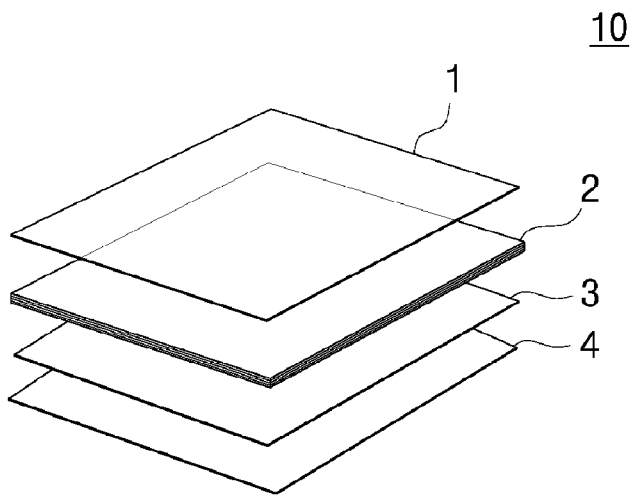
FIG. 1 is an exploded perspective view showing a magnetic field shield sheet for a wireless charger according to the present invention.
Figure 2:
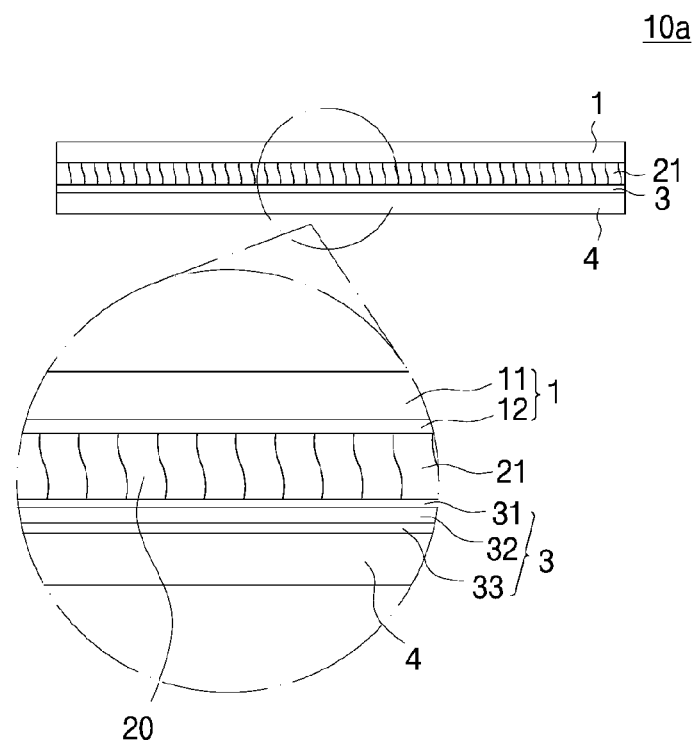
FIG. 2 is a cross-sectional view showing an example of using one piece of nanocrystalline ribbon sheet according to a first embodiment of the present invention.

FIG. 1 is an exploded perspective view showing a magnetic field shield sheet for a wireless charger according to the present invention, and FIG. 2 is a cross-sectional view showing an example of using one piece of nanocrystalline ribbon sheet according to a first embodiment of the present invention.

Referring to FIGS. 1 and 2, a magnetic field shield sheet 10 for a wireless charger according to the present invention includes: at least one layer (or a multi-layer) thin magnetic sheet 2 separated and/or cracked into a plurality of fine pieces 20, by thermally treating an amorphous alloy ribbon or nanocrystalline alloy ribbon and then performing a flake treatment process; a protective film 1 that is adhered on an upper portion of the thin magnetic sheet 2; a double-sided tape 3 that is adhered on a lower portion of the thin magnetic sheet 2; and a release film 4 that is separably adhered on a lower portion of the double-sided tape 3.

For example, a thin ribbon made of an amorphous alloy or nanocrystalline alloy may be used as the thin magnetic sheet 2.

A Fe-based or Co-based magnetic alloys may be used as the amorphous alloy, and considering the material cost, the Fe-based magnetic alloys are preferably used.

For example, Fe—Si—B alloys may be used as the Fe-based magnetic alloys. Here, it is preferable that the content of Fe is 70-90 atomic % (which will be abbreviated as at%), and the content of a sum of Si and B is 10-30 at %. The higher content of Fe and other metals may be, the higher the saturation magnetic flux density may be, but when the content of Fe is excessive, it is difficult to form an amorphous state. Thus, the content of Fe in the present invention is preferably 70-90 at %. In addition, when the content of the sum of Si and B is in the range of 10-30 at %, an amorphous forming capability of an alloy is the most excellent. In order to prevent corrosion, corrosion resistant elements such as Cr and Co can be added within 20 at % into this basic composition, and if necessary, other metallic elements may be included in small quantities in the basic composition to impart different properties.

The Fe—Si—B alloys can be used; for example, the crystallization temperature of a certain Fe—Si—B alloy is 508° C., and the Curie temperature (Tc) thereof is 399° C. However, the crystallization temperature can be varied depending on the content of Si and B, or the other metal elements and the content thereof added in addition to ternary alloy elements.

A Fe-based amorphous alloy, for example, a Fe—Si—B—Co-based alloy may be used according to the required conditions, in the present invention.

Meanwhile, a thin ribbon made of a Fe-based nanocrystalline magnetic alloy can be used as the thin magnetic sheet 2.

An alloy satisfying the following Equation 1 is preferably used as the Fe-based nanocrystalline magnetic alloy.

$$Fe_{100-c-d-e-f-g}A_cD_dE_eSi_fB_gZ_h \qquad \text{Equation 1}$$

In Equation 1, an element A is at least one element selected from Cu and Au, an element D is at least one element selected from Ti, Zr, Hf, V, Nb, Ta, Cr, Mo, W, Ni, Co, and rare earth elements, an element E is at least one element selected from Mn, Al, Ga, Ge, In, Sn, and platinum group elements, an element Z is at least one element selected from C, N, and P, c, d, e, f, g, and h are numbers that satisfy the following relational expressions $0.01 \leq c \leq 8$ at %, $0.01 \leq d \leq 10$ at %, $0 \leq e \leq 10$ at %, $10 \leq f \leq 25$ at %, $3 \leq g \leq 12$ at %, $15 \leq f+g+h \leq 35$ at %, respectively, and the alloy structure of an area ratio of 20% or more is formed of the fine structure of the particle size of equal to or less than 50 nm.

In the aforementioned Equation 1, the element A is used to enhance corrosion resistance of the alloy, to prevent coarsening of crystal grains and at the same time, improve the magnetic properties such as the iron loss and the permeability of the alloy. When the content of the element A is too small, it is difficult to obtain the effect of suppressing coarsening of crystal grains. Conversely, when the content of the element A is excessively large, the magnetic properties are degraded. Thus, it is preferable that the content of the element A is in the range from 0.01 to 8 at %. The element D is an element that is effective for the uniformity of the crystal grain diameter, the reduction of magnetostriction, etc. It is preferable that the content of the element D is in the range from 0.01 to 10 at %.

The element E is an element that is effective for the soft magnetic properties of the alloy and improvement of corrosion resistance of the alloy. The content of the element E is preferably not more than 10 at %. The elements Si and B are elements that make the alloy to become amorphous at the time of producing the magnetic sheet. It is preferable that the content of the element Si is in the range from 10 to 25 at %, and it is preferable that the content of the element B is in the range from 3 to 12 at %. In addition, it may include the element Z as an element that makes the alloy to become amorphous, other than Si and B. In that case, the total content of the elements Si, B and Z is preferably in the range of 15 to 35 at %. It is preferable to implement the microcrystalline structure that crystal grains whose grain diameters are in the range of 5 to 30 nm exist in the range of 50 to 90% as an area ratio in the alloy structure.

Further, a Fe—Si—B—Cu—Nb alloy can be used as a Fe-based nanocrystalline magnetic alloy that is used in the thin magnetic sheet 2, and in this case, it is preferable that the content of Fe is 73-80 at %, the content of the sum of Si and B is 15-26 at %, and the content of the sum of Cu and Nb is 1-5 at %. An amorphous alloy that is obtained by producing such a composition range in the form of a ribbon can be easily precipitated into nanocrystalline grains by a thermal treatment to be described later.

Figure 4:
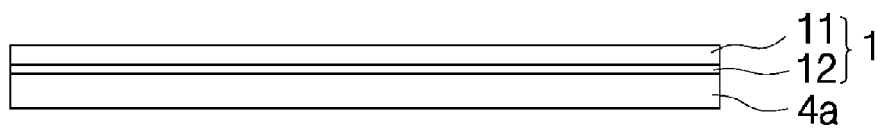
FIGS. 4 and 5 are cross-sectional views showing the structure of a protective film and a double-sided tape that are respectively used in the present invention.

As shown in FIG. 4, the protective film 1 may be implemented by using a resin film 11 including a polyethylene terephthalate (PET) film, a polyimide film, a polyester film, polyphenylene sulfade (PPS) film, a polypropylene (PP) film, or a fluorine resin-based film such as poly tetra fluoroethylene (PTFE), and is attached to one side of the thin magnetic sheet 2 through a first adhesive layer 12.

Further, the protective film 1 is 1 to 100 μm, in thickness, and it is preferably in the range of 10-30 μm, and it is more preferable to have a thickness of 20 μm.

When the protection film 1 used in the present invention 1 is attached on one side of the amorphous ribbon sheet that is used as the thin magnetic sheet 2, a release film 4a attached on the other surface of the first adhesive layer 12 to protect the first adhesive layer 12 is removed and then the protection film 1 is attached on one side of the amorphous ribbon sheet.

Figure 5:
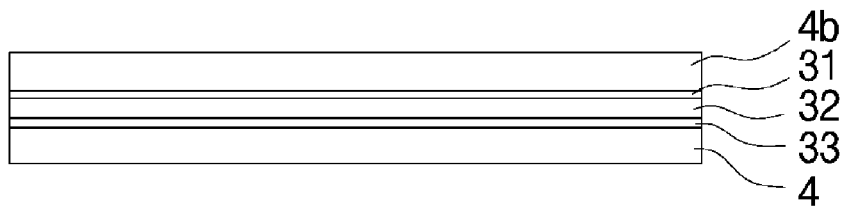

Further, as shown in FIG. 5, the double-sided tape 3 is formed of a base member 32 made of a fluorine resin-based film, for example, a PET (Polyethylene Terephthalate) film, on both sides of which second and third adhesive layers 31 and 33 are formed. Release films 4 and 4b are attached on the outer surfaces of the second and third adhesive layers 31 and 33, respectively. The release films 4 and 4b are integrally formed in the manufacture of the double-sided tape 3, and are peeled off and removed when the magnetic field shield sheet 10, 10a, or 10b is attached on an electronic device.

Figure 3:
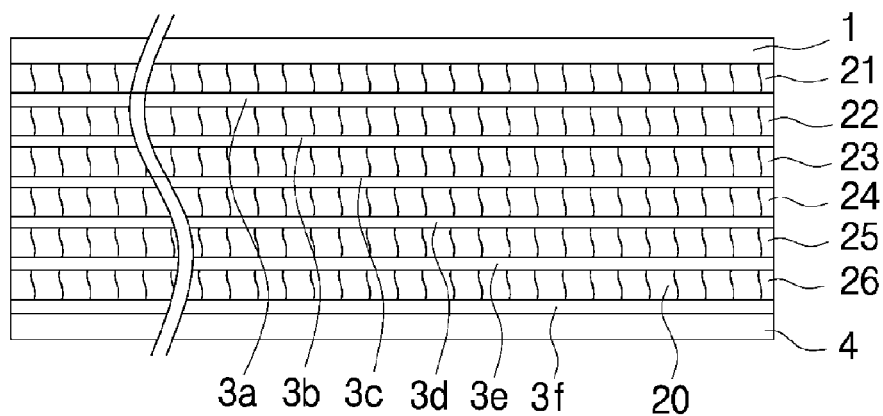
FIG. 3 is a cross-sectional view showing an example of using six pieces of nanocrystalline ribbon sheets according to a second embodiment of the present invention.

As illustrated in FIG. 3, in order to interconnect a plurality of amorphous ribbon sheets 21-26, all release films 4 and 4b of FIG. 5 are removed from both sides of double-sided tapes 3a-3f interposed between the amorphous ribbon sheets 21-26.

The double-sided tapes 3 and 3a-3f may be a type of including a base member as described above, but may be a type of including no base member but being formed of only adhesive layers. In the case of the double-sided tapes 3a-3f interposed between the amorphous ribbon sheets 21-26, it is preferable to use no-base type double-sided tapes in terms of a thinning process.

The first to the third adhesive layers 12, 31, and 33 may be implemented by using, for example, acrylic adhesives, but may be of course possibly implemented by using different types of adhesives, as illustrated in FIG. 2.

The double-sided tapes 3 and 3a-3f may have 10, 20, 30 μm thick, preferably have a thickness of 10 μm.

One piece of the thin magnetic sheet 2 that is used for the shield sheet 10, 10a or 10b may have a thickness of 15 to 35 μm for example. In this case, in consideration of a handling process after the heat treatment of the thin magnetic sheet 2, a thickness of the thin magnetic sheet 2 is preferably set to be in the range of 25 to 30 μm. The thinner the thickness of the ribbon may be, a breakage phenomenon of the ribbon may occur due to even a little shock at the time of performing a handling process after the heat treatment.

Figure 16:
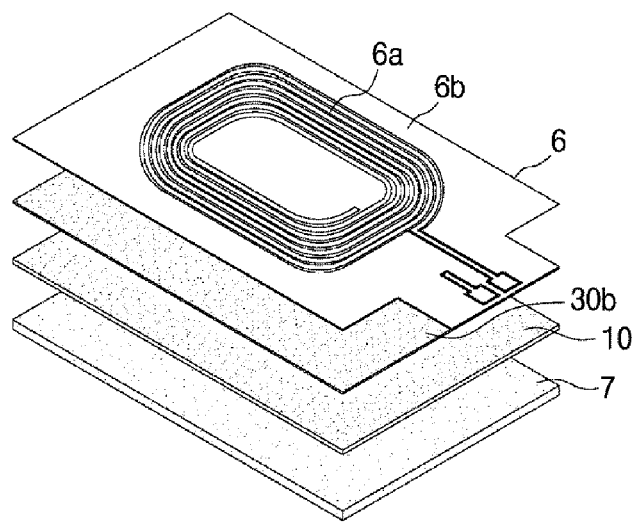
FIG. 16 is an exploded perspective view showing a structure that a magnetic field shield sheet according to the present invention is applied to a reception device for a wireless charger.
Figure 17:
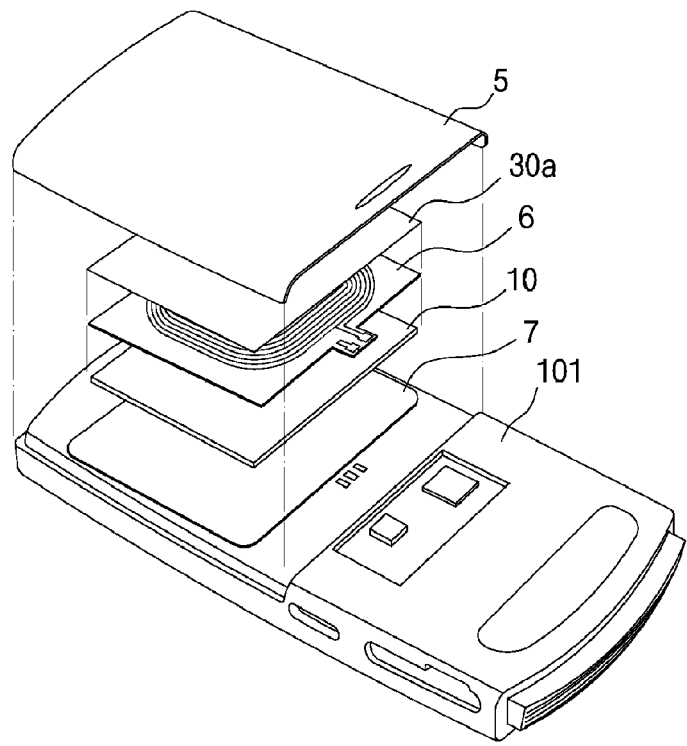
FIG. 17 is an exploded perspective view showing that the reception device for a wireless charger of FIG. 16 is assembled with a battery cover and coupled with a portable terminal.

Meanwhile, when a reception device for a wireless charger is mounted and used in a battery cover 5 of a mobile terminal device 101 of FIG. 17, a secondary coil (reception coil) 6 is attached to and used for a magnetic field shield sheet 10 as illustrated in FIGS. 16 and 17, in the case of the magnetic field shield sheet 10. In this case, the secondary coil 6 forms a resonant circuit and therefore, the shield sheet 10 influences on inductance of the resonant circuit formed by the secondary coil (receiving coil) 6.

In this case, the magnetic filed shield sheet 10 serves as an inductor that plays a role of shielding a magnetic field to block effects of a wireless power signal from a transmission device on the portable terminal 101 and simultaneously plays a role of guiding the wireless power signal to be received at the secondary coil of the reception device 6 in high efficiency.

Preferably, the thin magnetic sheet 2 is separated into a plurality of fine pieces 20 through a flake treatment process, and the plurality of fine pieces 20 have a size of several tens of micrometers (μm) to equal to or less than three (3) mm.

In the case that the thin magnetic sheet 2 is flake-processed and separated into a plurality of fine pieces 20, reduction of a value of the inductance (L) of the magnetic sheet is achieved larger than reduction of the magnetoresistance (R) of the magnetic sheet. As a result, if the thin magnetic sheet 2 is made to be flake-processed, a quality factor (Q) of the resonant circuit formed by the secondary coil of the reception device 6 is increased, and thus power transmission efficiency is increased.

Further, in the case that the thin magnetic sheet 2 is separated into a plurality of fine pieces 20, the heat generation problem of the battery can be blocked by reducing losses due to eddy currents.

Figure 10:
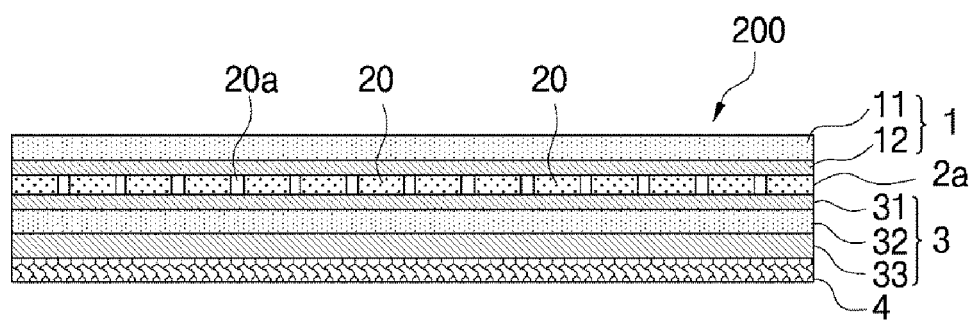
FIG. 10 is a cross-sectional view showing a state where a laminate sheet is flake-processed according to the present invention.
Figure 13:
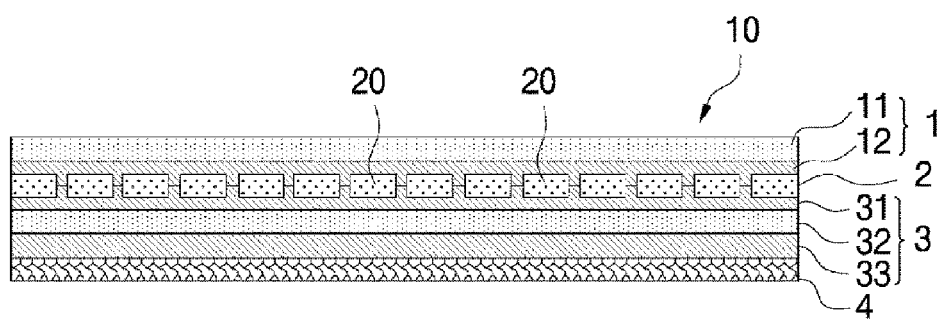
FIG. 13 is a cross-sectional view showing a state where a magnetic field shield sheet for a wireless charger according to a first embodiment of the present invention has been flake-processed and then laminated.

Furthermore, in the case that a thin magnetic sheet 2a is flaked in the present invention as shown in FIG. 10 and then a thin magnetic sheet 2 is laminated as shown in FIG. 13, parts of first and second adhesive layers 12 and 31 penetrate into gaps 20a of FIG. 10 between the plurality of fine pieces 20. Accordingly, the plurality of fine pieces 20 are isolated as adhesives that act as dielectrics.

As a result, in the case that only a flake treatment process is simply done, the fine pieces 20 are in contact with each other according to flow of the fine pieces 20, and thus the size of the fine pieces 20 increases to thereby cause a problem of increasing the eddy current losses, but block the problem from occurring, since the whole surface of the fine pieces 20 is surrounded by the dielectric, through the laminating process.

As shown in FIG. 2, a magnetic field shield sheet 10a for a wireless charger according to a first embodiment of the present invention has a structure that one amorphous ribbon sheet 21 is used in which a protective film 1 is bonded on one side of the amorphous ribbon sheet 21, and a release film 4 is bonded via a double-sided tape 3 on the other side of the amorphous ribbon sheet 21.

Further, a magnetic field shield sheet 10b according to a second embodiment of the present invention as illustrated in FIG. 3, a number of amorphous ribbon sheets 21-26 are laminated and used as a thin magnetic sheet to increase the quality factor Q and the power transfer efficiency of the secondary coil 6.

A permanent magnet to assist an alignment with the reception device can be adopted in the power transmission device in the wireless charger in order to enhance efficiency of the charger at maximum. That is, a circular permanent magnet is provided inside a primary coil (transmission coil) of the transmission device, and thus the exact alignment of the reception device overlying the transmission device is achieved to thereby hold the reception device to be stuck.

Accordingly, the magnetic field shield sheet for a wireless charger is required to shield both alternating-current (AC) magnetic fields that are generated by the power transfer of a frequency of 100 KHz to 150 KHz from the transmission device, as well as direct-current (DC) magnetic fields that are generated by the permanent magnets.

By the way, since the DC magnetic fields influence upon the magnetic field shield sheet 10, greater than the AC magnetic fields, the thin shield sheet is magnetically saturated to thereby cause problems of dropping a shielding performance as the shield sheet or sharply reducing power transmission efficiency.

Thus, in the case that the permanent magnet is employed in the transmission device of the wireless charger, it is required to determine the amorphous ribbon sheets 21-26 to be laminated by taking into account a number of layers whose magnetic saturation is achieved by the permanent magnet.

In addition, the Fe-based amorphous alloys are greater than the nanocrystalline alloys in view of the saturation field. Accordingly, in the case that amorphous ribbon sheets 21-26 made of the Fe-based amorphous alloys are used, 2 to 8 layers can be used by stacking one on another. For example, using 3 to 5 layers is preferably to obtain high magnetic permeability. In this case, the inductance of the laminate sheet (i.e., permeability) is preferably in the range of about 13 μH to 19 μH.

Further, in the case that the amorphous ribbon sheets 21-26 made of nanocrystalline alloy are used, 4 to 12 layers are laminated to then be used, for example, it is preferable to use 7 to 9 layers to obtain high magnetic permeability. In this case, the inductance of the laminate sheet (i.e., permeability) is preferably in the range of about 13 μH to 21 μH.

Meanwhile, in the case that no permanent magnet is adopted in the transmission device of the wireless charger, it is possible to use a relatively small number of amorphous ribbon sheets when compared with the case of employing permanent magnets.

In this case, in the case that amorphous ribbon sheets made of the Fe-based amorphous alloys or nanocrystalline alloys are used, 1 to 4 layers are laminated to then be used. In this case, the inductance of the laminate sheet (i.e., permeability) is preferably in the range of about 13 μH to 21 μH.

Referring to FIG. 3, a number of amorphous ribbon sheets, for example, six-layer amorphous ribbon sheets 21-26 are laminated and used as a thin magnetic sheet, and a number of adhesive layers or double-sided tapes 3a-3f are inserted between the amorphous ribbon sheets 21-26.

That is, when the fine pieces 20 that have been separated at the time of the flake treatment and laminating processes maintain the separate positions, it is required that the adhesive layers or double-sided tapes 3a-3f should be inserted and laminated between the amorphous ribbon sheets 21-26, so that gaps 20a between the fine pieces 20 are filled with the adhesive layers or double-sided tapes 3a-3f.

The magnetic field shield sheets 10, 10a and 10b according to the present invention constitute a quadrangle such as a rectangular or square shape which usually corresponds to the battery cells, but constitute a polygonal shape such as a pentagon, or a circular or oval shape, and a combination of a rectangular shape and a circular shape partly. Preferably, the magnetic field shield sheets have shapes corresponding to the shape of a region for which a magnetic field shielding action is required.

Figure 6:
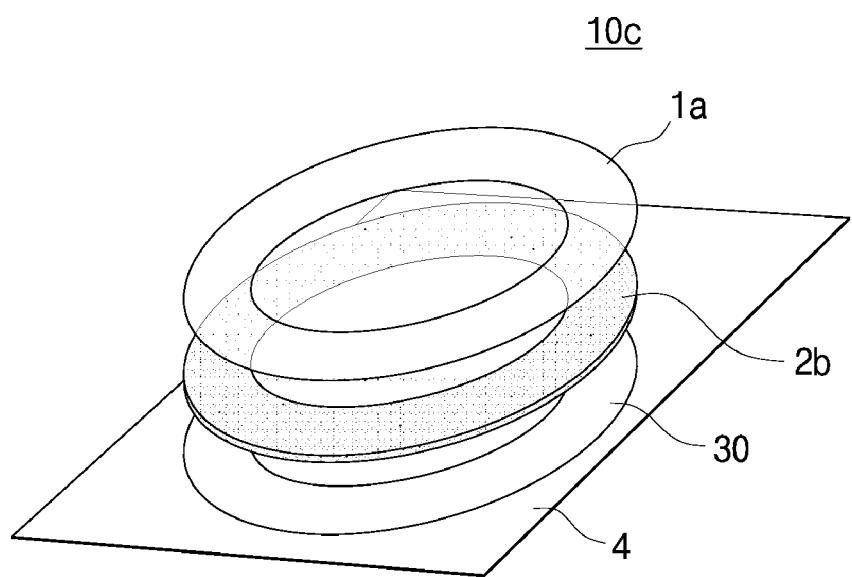
FIG. 6 is an exploded perspective view showing a magnetic field shield sheet for a wireless charger according to a third embodiment of the present invention.

Further, the magnetic field shield sheet according to the present invention may be molded into an annular shape corresponding to a secondary coil of a reception device like a magnetic field shield sheet 10c shown in FIG. 6 according to a third embodiment of the present invention, to prevent a phenomenon that the magnetic field shield sheet is magnetized (or saturated) by a magnetic field of a permanent magnet, in the case that the permanent magnet is included at a central portion of a primary coil of a transmission device of a wireless charger.

The magnetic field shield sheet 10c according to the third embodiment is made in any one of the correspondingly rectangular, circular, and elliptical shape, when the secondary coil is composed of any one of a rectangular, circular, and oval shape. In this case, the magnetic field shield sheet 10c is preferably made of a width by about 1-2 mm wider than that of the secondary coil 6.

The magnetic field shield sheet 10c according to the third embodiment may have a structure that an annular thin magnetic sheet 2b on the upper surface of which an annular protective film 1a is attached is attached to a release film 4 through an annular double-sided tape 3.

The annular magnetic field shield sheet 10c is preferably configured by using a release film 4 of a rectangular shape having an area larger than that of the annular magnetic field shield sheet 10c so as to be easily peeled off from the release film 4.

Figure 7:
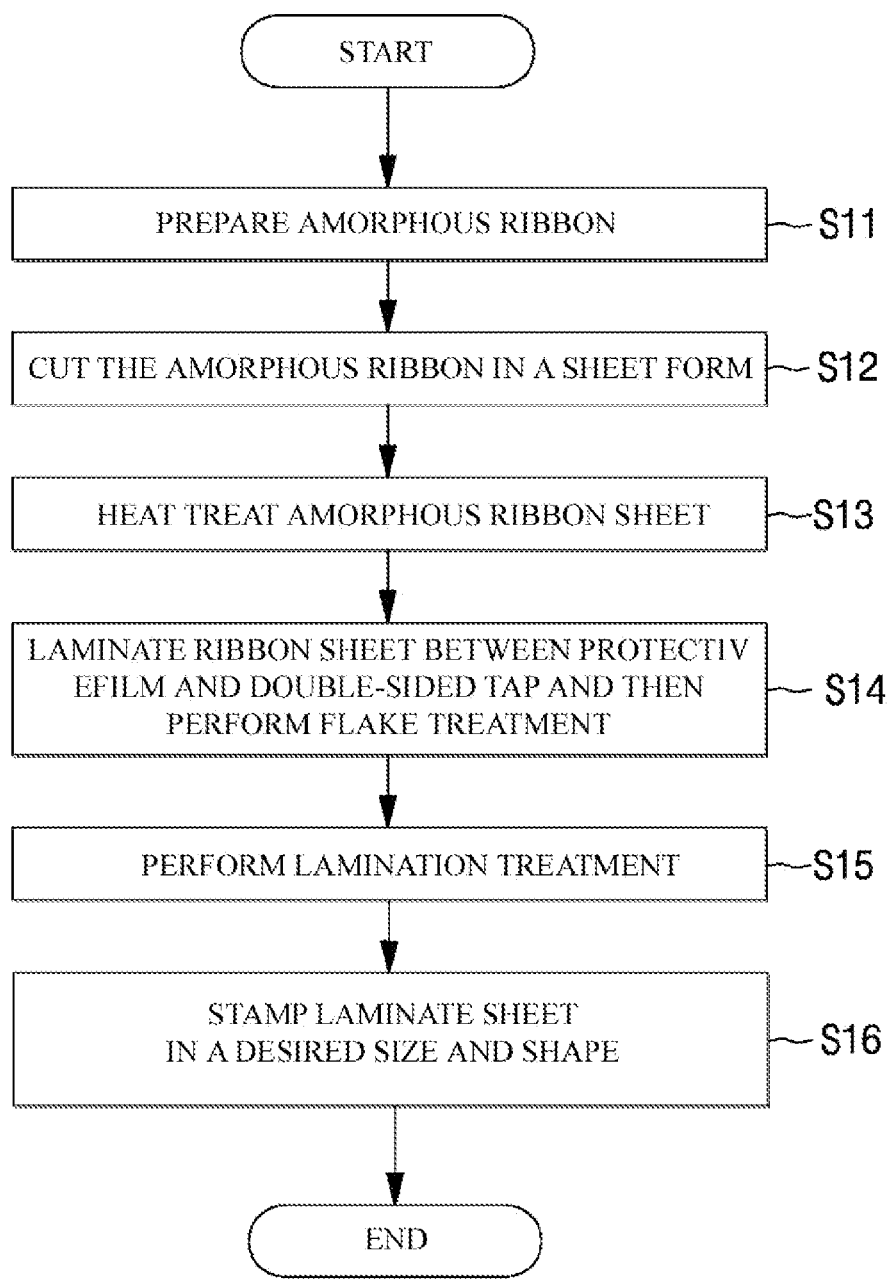
FIG. 7 is a flowchart view for describing a process of manufacturing a magnetic field shield sheet for a wireless charger according to the present invention.

Hereinbelow, a method of manufacturing the magnetic field shield sheet according to the present invention will be described with reference to FIG. 7.

First, an amorphous ribbon 2a (of FIG. 10) consisting of an amorphous alloy or nanocrystalline alloy is prepared by a rapidly solidification process (RSP) due to melt spinning (S11), and is cut in a predetermined length to then be laminated in a sheet form (S12) so that post-processing after a heat treatment can be easily performed.

In the case that the amorphous ribbon 2a is an amorphous alloy, an ultra-thin amorphous ribbon equal to or less than 30 μm made of a Fe-based amorphous ribbon, for example, a Fe-Si-B or Fe-Si-B-Co alloy is prepared by the rapidly solidification process (RSP) due to melt spinning, and then a laminated amorphous ribbon sheet is heat-treated under no magnetic circumstances for 30 minutes to 2 hours in a temperature range of 300° C. to 600° C., so as to obtain a desired permeability (S13).

In this case, since the heat treatment is performed under an atmosphere of a temperature range at which oxidation is not generated even if the Fe content of the amorphous ribbon $2a$ is high, it is not necessary for the heat treatment to be done in an atmosphere furnace, but the heat treatment may proceed in air. In addition, even if the heat treatment is made under an oxidizing atmosphere or a nitrogen atmosphere, permeability of the amorphous ribbon has substantially no difference at the same temperature condition.

In the case that the heat treatment temperature is less than 300° C., the permeability higher than a desired permeability is obtained and it takes a longer time for the heat treatment. In addition, in the case of exceeding 600° C., the permeability is significantly lowered by an overheat treatment, to thus fail to obtain a desired permeability. Generally, when the heat treatment temperature is low, it takes a long time for the heat treatment. In contrast, when the heat treatment temperature is high, the heat treatment time is shortened.

Further, in the case that the amorphous ribbon $2a$ is made of a nanocrystalline alloy, a Fe-based amorphous ribbon, for example, an ultra-thin amorphous ribbon equal to or less than 30 μm made of a Fe-based amorphous ribbon, for example, a Fe—Si—B—Cu—Nb alloy is prepared by the rapidly solidification process (RSP) due to melt spinning, and then a laminated amorphous ribbon sheet is heat-treated under no magnetic circumstances for 30 minutes to 2 hours in a temperature range of 400° C. to 700° C., so as to obtain a desired permeability (S13).

In this case, the Fe content of the amorphous ribbon $2a$ is equal to or more than 70 at %. Therefore, if the heat treatment is made in the air, the oxidation is generated and thus the heat treatment atmosphere is undesirable in terms of a visual appearance. Thus, it is preferable that the heat treatment should be performed in a nitrogen atmosphere. However, even if the heat treatment is made under an oxidizing atmosphere, permeability of the sheet has substantially no difference at the same temperature condition.

In this case, when the heat treatment temperature is less than 400° C., nanocrystalline particles are not sufficiently produced, and a desired permeability is not obtained. Further, it takes a longer time for the heat treatment. In addition, in the case of exceeding 700° C., the permeability is significantly lowered by an overheat treatment. When the heat treatment temperature is low, it preferably takes a long time for the heat treatment. In contrast, when the heat treatment temperature is high, the heat treatment time is preferably shortened.

Further, a thickness of the amorphous ribbons $2a$ of the present invention is in the range of 15 to 35 μm, and permeability of the amorphous ribbon $2a$ increases in proportion to the thickness of the ribbon.

Furthermore, when the heat treatment is made, the amorphous ribbon is strong for embrittlement. Accordingly, when a flake treatment process is carried in a subsequent step, the flake treatment process can be easily made.

Subsequently, a layer or a multi-layer of the amorphous ribbon $2a$ whose heat treatment has been made are used as many as a desired number of layers, and then a flake treatment process is performed in a state where a double-sided tape 3 is attached (S14) in which the protective film 1 is attached to one side of double-sided tape 3 and the release film 4 is attached to the other side of the double-sided tape 3.

Figure 8:
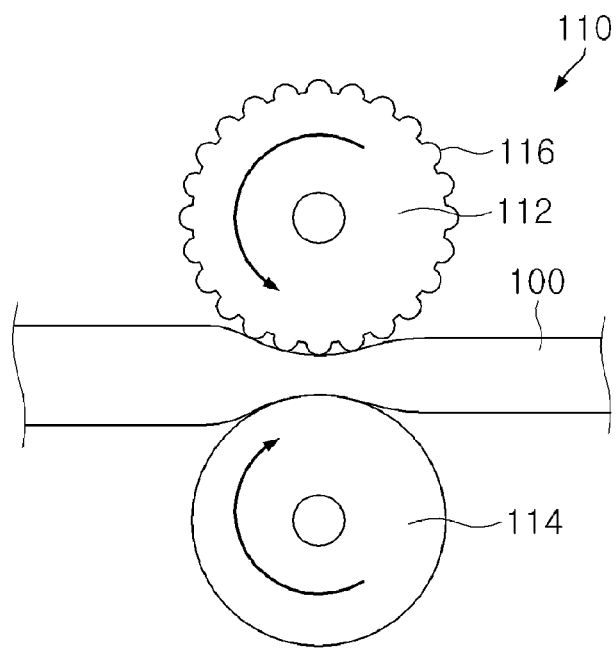
FIGS. 8 and 9 are cross-sectional views showing a flake treatment process of a laminate sheet according to the present invention, respectively.
Figure 9:
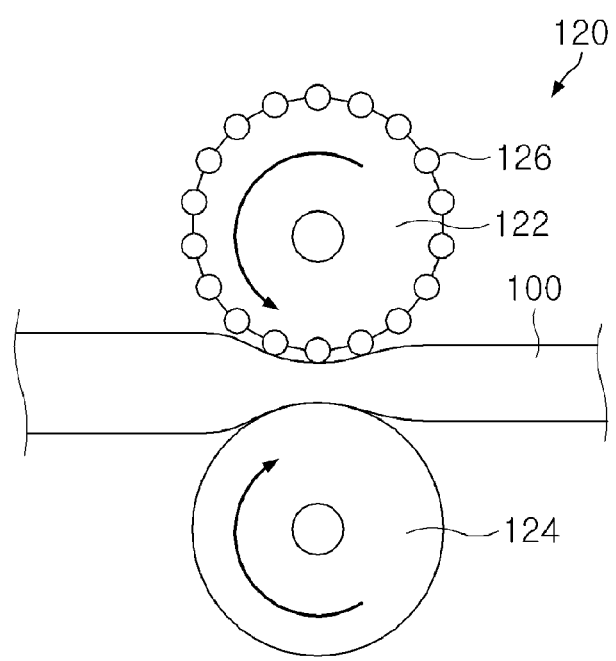

The flake treatment process is performed to make a laminate sheet 100 where the protective film 1, the amorphous ribbon $2a$, the double-sided tape 3, and the release film 4 are sequentially stacked, passed through first and second flake devices 110 and 120, for example, as shown in FIGS. 8 and 9, to thereby allow the amorphous ribbon $2a$ to be separated into a number of fine pieces 20. In this case, as shown in FIG. 10, the separated fine pieces 20 maintain a state of being separated by first and second adhesive layers 12 and 31 bonded to both side surfaces of the amorphous ribbon $2a$.

For example, as shown in FIG. 8, an available flake device 110 may consist of a metal roller 112 on the outer surface of which a plurality of irregularities 116 are formed, and a rubber roller 114 that is disposed in opposition to the metal roller 112. As shown in FIG. 9, a second flake device 120 may be composed of a metal roller 122 on the outer surface of which a plurality of spherical balls 126 are mounted, and a rubber roller 124 that is disposed in opposition to the metal roller 122.

Thus, when the laminate sheet 100 is passed through the first and second flake devices 110 and 120, the amorphous ribbon $2a$ is separated into the fine pieces 20 and gaps $20a$ are formed between the fine pieces 20, as shown in FIG. 10.

Since the fine pieces 20 of the amorphous ribbon $2a$ are formed to have a size of a range of several tens micrometers (gm) to 3 milimeters (mm), a reverse magnetic field is made to increase to thereby remove a hysteresis loss and to thus heighten a uniformity of the permeability of the sheet.

Further, the flake treatment process of the amorphous ribbon $2a$ may reduce the surface area of the fine pieces 20 and prevent a heat generation problem caused by an eddy current that is produced by an alternating-current magnetic field.

The flake treated laminate sheet 200 has the gaps $20a$ between fine pieces 20. Thus, when the water is penetrated into the gaps $20a$, the amorphous ribbon is oxidized and the appearance of the amorphous ribbon is poor and the shield performance is degraded.

Further, in the case that only a flake treatment process is performed, the fine pieces 20 are in contact with each other along the flow of the fine pieces 20, to accordingly increase the size of the fine pieces 20 and to thus cause a problem that the eddy-current loss increases.

Furthermore, the flake treated laminate sheet 200 may have non-uniformity caused on the surface of the sheet during performing the flake treatment process, and stabilization of the flake treated ribbon is needed.

Thus, the flake treated laminate sheet 200 undergoes a laminating process for flattening, slimming, and stabilization of the sheet 200, while simultaneously filling the adhesive into the gaps $20a$ of the fine pieces 20 (S15). As a result, water penetration is prevented, and at the same time all sides of the fine pieces 20 are surrounded by the adhesive, to thereby separate the fine pieces 20 from one another and reduce the eddy current.

Figure 11:
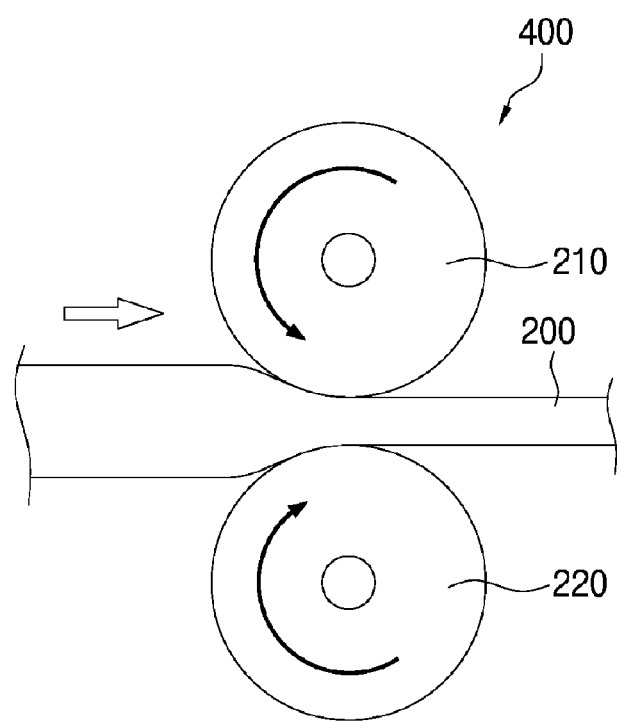
FIGS. 11 and 12 are cross-sectional views showing a laminating process of a flake-treated laminate sheet according to the present invention, respectively.
Figure 12:
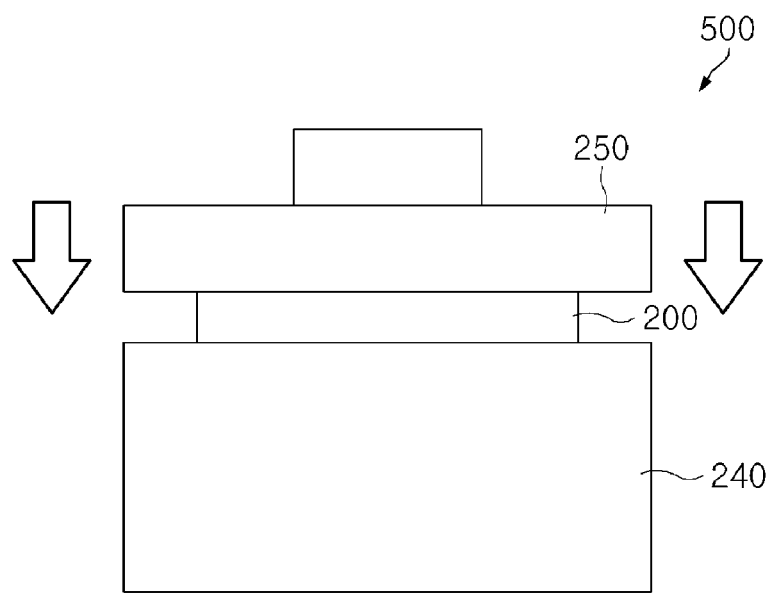

As shown in FIG. 11, a laminating device 400 for the laminating process may employ a roll press type including a first pressing roller 210 and a second pressing roller 220 that is disposed at a predetermined distance from the first pressing roller 210, between which the flake treated laminate sheet 200 passes. As shown in FIG. 12, a laminating device 500 for the laminating process may employ a hydraulic press type including a lower pressing member 240 and an upper pressing member 250 that is vertically movably disposed on the upper side of the lower pressing member 240.

When the flake treated laminate sheet 200 is heated at room temperature or at a temperature of 50° C. to 80° C., and then is passed through the laminating device 400 or 500, a first adhesive layer 12 of the protective film 1 is pressed, while some of the adhesive of the first adhesive layer 12 are introduced into the gaps $20a$ to seal the gaps $20a$. Simultaneously, the double-sided tape 3 is pressed, while some of the adhesive of the second adhesive layer 31 are introduced into the gaps 20a to seal the gaps 20a.

Here, the first adhesive layer 12 and the second adhesive layer 31 may be formed by using an adhesive that can be deformed at the time of being pressed at room temperature, or may be formed by using a thermoplastic adhesive that can be thermally deformed by applied heat.

In addition, the first adhesive layer 12 and the second adhesive layer 31 preferably have a thickness of at least 50% when compared to the thickness of the amorphous ribbon so as to sufficiently fill the gaps 20a between the fine pieces 20.

Further, the interval between the first pressure roller 210 and the second pressure roller 220 and the interval between the upper pressing member 250 and the lower pressing member 240 when the upper pressing member 250 is in a lowered state, are preferably formed of a thickness of 50% or less when compared to the thickness of the laminate sheet 200, so that the adhesive of the first adhesive layer 12 and the second adhesive layer 31 can be introduced into the gaps 20a.

Any device of performing the pressing of the laminate sheets 100 and 200 and the flake treatment process, can be used in the present invention.

As shown in FIG. 13, when the laminating process is completed, an electromagnetic wave absorbing sheet 10 according to the present invention may have a structure that the first adhesive layer 12 and the second adhesive layer 31 partially fill the gaps 20a between the fine pieces 20 at a state where the amorphous ribbon 2a is separated into the fine pieces 20, to thereby prevent the oxidation and the flow of the amorphous ribbon 2a.

Finally, the magnetic field shield sheet 10 having undergone the laminating process is stamped into the size and shape necessary for place and use for electronic devices so as to be produced into products (S16).

In the case that six sheets of the amorphous ribbon sheets 21-26 are stacked as the thin magnetic film, in the present invention, as shown in FIG. 3, a thickness of the magnetic filed shield sheet 10b including the protective film 1 and the release film 4 is 212 µm before the laminating process is performed, but the former is 200 µm after laminating process is performed.

In the embodiment, it has been described with respect to the case that a sheet of the protective film 1 is adhered to one side of the magnetic sheet 2 and then the flake treatment process and the laminating process are executed, but the protective film 1 may be damaged by the flake treatment process. Thus, preferably, a temporary protective film for protecting the protective film 1 is attached on top of the protective film 1 before performing a treatment process, and then the temporary protective film on the surface of the magnetic sheet 2 is peeled off and removed after completion of the treatment process.

Humidity Test humidity test was conducted for 120 hours at temperature of 85° C. and humidity of 85% with respect to the magnetic field shield sheet 10 obtained in accordance with the invention and the laminate sheet 200 that has undergone the flake process but does not pass through the lamination process.

Figure 14A:
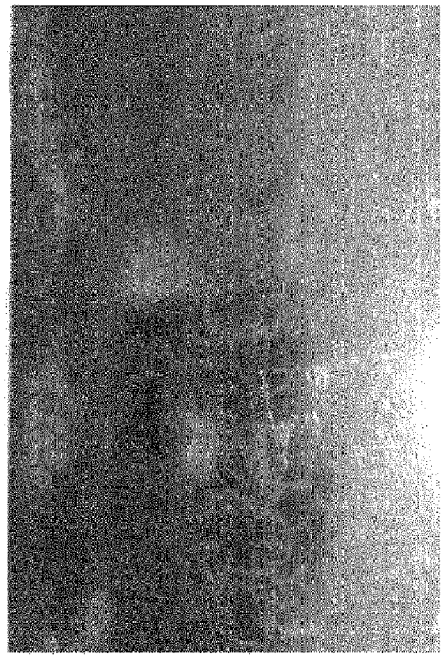
FIG. 14A is an enlarged photograph of a magnetic field shield sheet that has not passed through a laminating process after having performed a flake treatment process, but has undergone a humidity test.
Figure 14B:
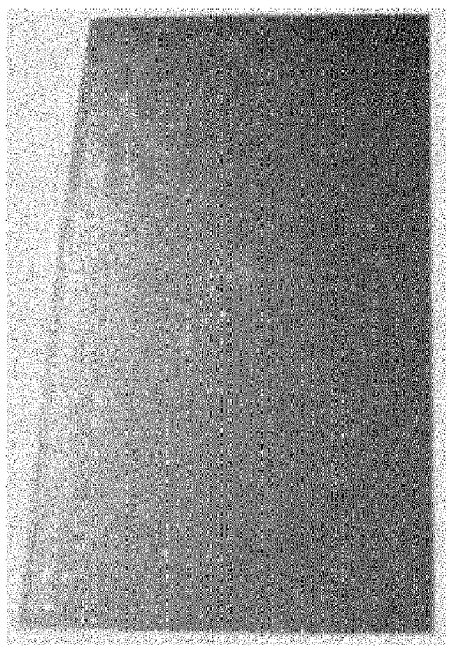
FIG. 14B is an enlarged photograph of a magnetic field shield sheet that has passed through a laminating process after having performed a flake treatment process and has undergone a humidity test.

As a result, as shown in FIG. 14A, in the case of the laminate sheet 200 whose only the flake-treatment was processed, it can be seen that water is penetrated into the gaps between fine pieces when the amorphous ribbon has been separated into a large number of fine pieces and then the amorphous ribbon is oxidized, and thus the appearance of the amorphous ribbon was changed. However, it can be seen that the magnetic field shield sheet 10 in accordance with the present invention shows the appearance that does not change as shown in FIG. 14B.

Figure 15A:
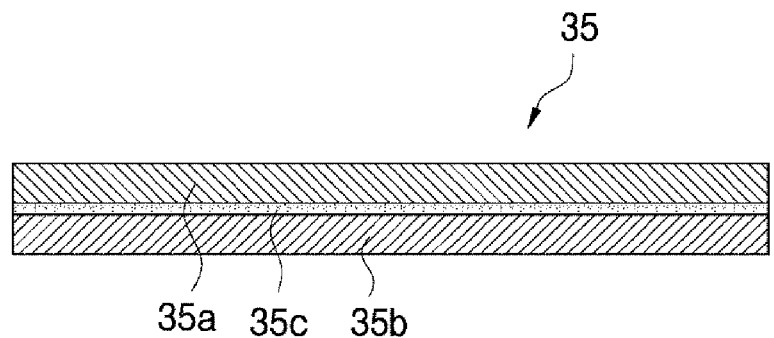
FIGS. 15A and 15B are a cross-sectional view and a plan view showing a thin magnetic sheet that is used in a magnetic field shield sheet for a wireless charger according to a fourth embodiment of the present invention.
Figure 15B:
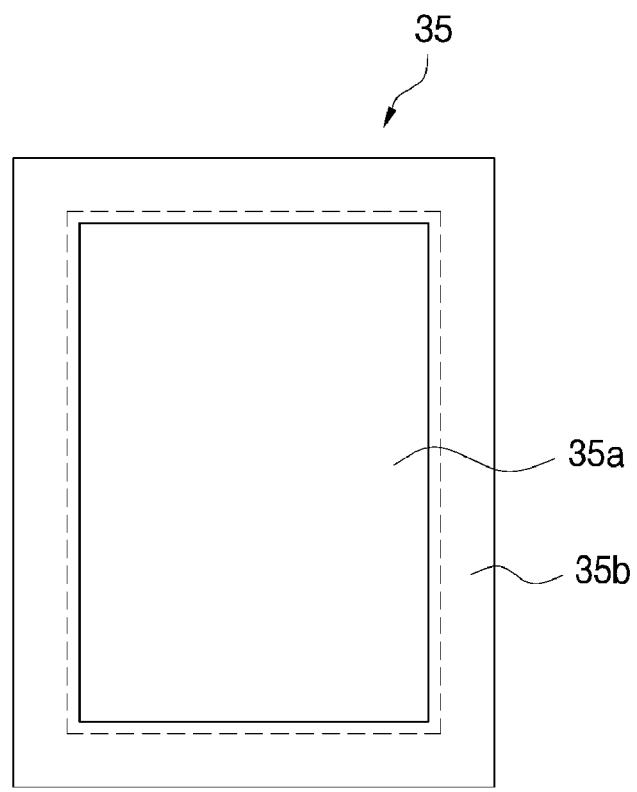

The magnetic field shield sheet according to the present invention may be configured by using dissimilar materials illustrated in FIGS. 15a and 15b as a thin film magnetic sheet.

As shown in FIG. 15A, a thin film magnetic sheet 35 can be configured in a hybrid form in which a bonding layer 35c is inserted and combined between a first magnetic sheet 35a of a high permeability and a second magnetic sheet 35b of a permeability lower than that of the first magnetic sheet 35a.

An amorphous ribbon sheet consisting of the above-described amorphous alloy or nanocrystalline alloy, a permalloy sheet having an excellent soft magnetic characteristic, or a MPP (Moly Permalloy Powder) sheet can be used as the first magnetic sheet 35a.

The second magnetic sheet 35b may be formed of a polymer sheet consisting of a magnetic powder of a high permeability such as an amorphous alloy powder, soft magnetic powder, or a sendust, and a resin.

In this case, the amorphous alloy powder has a composition selected from the group consisting of for example, Fe—Si—B, Fe—Si—B—Cu—Nb, Fe—Zr—B and Co—Fe—Si—B, and preferably is formed of an amorphous alloy powder comprising one or more amorphous alloys.

Further, in the case that both a near field communications (NFC) function and a wireless charging function are employed in a portable terminal, the hybrid-type thin film magnetic sheet 35 is formed by using an amorphous ribbon sheet and a ferrite sheet with low frequency dependence that are laminated and stacked one over another, as the first and second magnetic sheets 35a and 35b, as shown in FIG. 15A. Accordingly, it is possible to solve both the near field communications (NFC) function and the wireless charging function by using the ferrite sheet for the magnetic field shield for the NFC and by using the amorphous ribbon sheet for the wireless charger.

Further, in the case that both a near field communications (NFC) function and a wireless charging function are employed in a portable terminal, the hybrid-type thin film magnetic sheet 35 may be formed by using a certain area of an amorphous ribbon sheet at a center of the hybrid-type thin film magnetic sheet 35, as a first magnetic sheet 35a, and by combining a second annular magnetic sheet 35b that surrounds the whole of the first magnetic sheet 35a on the outside of the first magnetic sheet 35a into a ferrite loop, as shown in FIG. 15B. That is, the ferrite having a relatively smaller permeability than the amorphous sheet is formed in a loop form and is arranged in the outer block of the amorphous sheet.

Meanwhile, a structure that the magnetic field shield sheet according to the present invention is employed in a reception device for a wireless charger will be described below with reference to FIGS. 16 and 17.

FIG. 16 is an exploded perspective view showing a structure that a magnetic field shield sheet according to the present invention is applied to a reception device for a wireless charger, and FIG. 17 is an exploded perspective view showing that the reception device for a wireless charger of FIG. 16 is assembled with a battery cover and coupled with a portable terminal.

Referring to FIG. 16, when a magnetic field shield sheet according to the present invention is applied to a reception device for a wireless charger, a receiving-side secondary coil 6 of the wireless charger is attached on an upper portion of a protective film of a magnetic field shield sheet 10 by using a double-sided tape 30b. In addition, a finishing material (not shown) is adhered to an adhesive layer 33 of the double-sided tape 30b that is exposed by removing the release film 4 from the lower portion of the magnetic field shield sheet 10, for example, as shown in FIG. 13.

Further, instead of the method for assembling the antenna, it is also possible to attach the secondary coil 6 of the wireless charger to the double-sided tape 3 after having removed the release film 4 of the magnetic field shield sheet 10.

As shown in FIG. 17, an assembly of the secondary coil 6 and the magnetic field shield sheet 10 is attached to a battery cover 5 for a portable terminal device 101 by using a double-sided tape 30a. Then, when the battery cover 5 is coupled to the mobile terminal device 101, the magnetic field shield sheet 10 is used in the form of a cover of the battery 7.

An assembly position of the magnetic field shield sheet 10 may be disposed in the outside of the battery, or may be disposed in a well-known method.

The secondary coil 6 having a well-known structure may be also used. For example, the secondary coil 6 may be configured to have a spiral coil 6a made of any one of a rectangular, round, oval shape on a substrate made of a synthetic resin 6b such as a polyimide (PI), as shown in FIG. 16.

The secondary coil 6 may be assembled into a thin film structure by directly forming the spiral coil 6a on a single adhesive sheet that serves as an insulating layer in place of the synthetic resin substrate 6b and the double-sided tape 30b, for example, a double-sided tape in a transfer manner.

In this case, the spiral coil 6a that plays a role of receiving power wirelessly, may be also formed by winding a general coil in the form of a planar inductor to then be adhered on a substrate.

Meanwhile, the portable mobile terminal device 101 includes a rectifier (not shown) that rectifies an AC voltage generated in the spiral coil 6a of the secondary coil 6 into a direct-current (DC) voltage in the inside of a main body, in which the rectified DC voltage is charged into a battery (i.e., a secondary cell 7).

As described above, in the case that an assembly of the secondary coil 6 and the magnetic field shield sheet 10 is provided in the battery cover 5 of the portable terminal device 101, an influence upon the portable terminal device 101 by an AC magnetic field generated when a wireless charging function is implemented in a non-contact (wireless) manner in the mobile terminal device 101 can be blocked and electromagnetic waves required to perform the wireless charging function can be absorbed.

That is, as shown in FIG. 13, the magnetic field shield sheet 10 according to the present invention includes a multi-layer magnetic sheet 2 that is flake treated and separated into a plurality of fine pieces 20, to thereby increase a quality factor (Q), and to thus increase electric power transmission efficiency. In addition, the magnetic field shield sheet 10 is flake treatment processed, to thereby reduce a surface area of the ribbon and to accordingly prevent a heat generation problem caused by the eddy currents generated by the AC magnetic field.

As a result, the magnetic flux generated from the primary coil of the transmission device is blocked from being interlinked with a circuit board of the portable terminal device and the battery (or a secondary battery) 7 to thus suppress heat generation.

Figure 18:
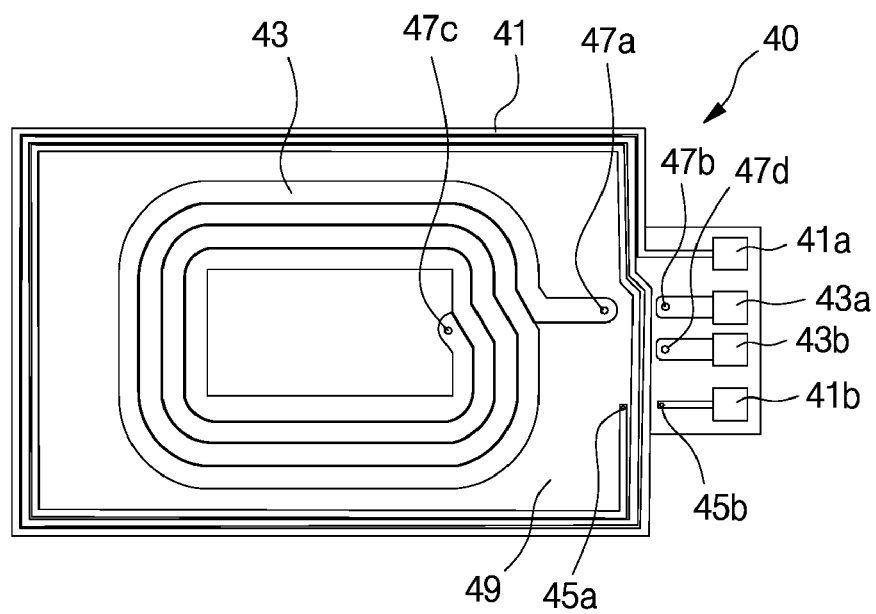
FIG. 18 is a plan view showing a dual-antenna structure in which an antenna for near field communications (NFC) and an antenna for a wireless charger are formed by using a flexible printed circuit board (FPCB).

Meanwhile, FIG. 18 is a plan view showing a dual-antenna structure in which an antenna for near field communications (NFC) and an antenna for a wireless charger are integrally formed by using a flexible printed circuit board (FPCB).

A dual antenna 40 that performs both the NFC function and the wireless charging function is preferably implemented by using a flexible printed circuit board (FPCB) having a double-sided substrate structure. However, the dual antenna according to the present invention is not limited thereto, but a different type of an antenna structure may be used.

Referring to FIG. 18, a dual antenna 40 is configured to include, for example, a NFC antenna coil 41 and a wireless charger antenna coil 43 that are formed together on a substrate 49. The substrate 49 may be configured by using, for example, a double-sided adhesive tape, and the NFC antenna coil 41 and the wireless charger antenna coil 43 are formed on the adhesive substrate 49 by using a transfer method.

Since the NFC antenna coil 41 has a higher frequency band than the wireless charger antenna coil 43, the NFC antenna coil 41 is formed to have a conductive pattern of a rectangular shape of a fine line width along the outside of the substrate 49. In addition, since the wireless charger antenna coil 43 requires the power transmission and uses a lower frequency band than the NFC antenna coil 41, the wireless charger antenna coil 43 is formed in the inside of the NFC antenna coil 41 to have a conductive pattern of a substantially elliptical shape of a line width wider than the width of the NFC antenna coil 41.

The dual antenna 40 is configured to have a pair of terminal strips 41a and 41b, and 43a and 43b, which are disposed on a projection of the substrate 49 respectively extended at one side of the NFC antenna coil 41 and the wireless charger antenna coil 43.

The outer line of the NFC antenna coil 41 is directly connected to a first terminal block 41a, and the inner line thereof is connected to a second terminal block 41b via a terminal connecting pattern (not shown) that is formed on the rear surface of the substrate 49 through conductive throughholes 45a and 45b.

Similarly, the outer line of the wireless charger antenna coil 43 is connected to a third terminal block 43a via a terminal connecting pattern (not shown) that is formed on the rear surface of the adhesive substrate 49 through conductive throughholes 47a and 47b, and the inner line thereof is connected to a fourth terminal block 43b via a terminal connecting pattern (not shown) that is formed on the rear surface of the substrate 49 through conductive throughholes 47c and 47d.

A protective film for protecting an antenna coil pattern such as, for example, PSR (Photo Solder Resist) is preferably formed on the surface of the substrate 49.

In the case that both the NFC function and the wireless charging function are employed, as described above, a shield sheet employing a hybrid type magnetic sheet of FIGS. 15A and 15B may be used.

Hereinafter, embodiments of the present invention will be described in more detail. However, the following examples of the present invention are nothing but illustrative and the scope of the present invention is not limited thereto.

Examples 1-4 and Comparative Examples 1-3

Electrical Characteristics of Magnetic Field Shield Sheets

No magnetic field shield sheet was used (Comparative Example 1). A magnetic field shield sheet using one amorphous ribbon sheet that was not heat treated (Comparative Example 2), a magnetic field shield sheet using one nanocrystalline ribbon sheet that was heat treated (Comparative Example 3), a magnetic field shield sheet using one nanocrystalline ribbon sheet that was heat treated and flake treated (Example 1), a magnetic field shield sheet using two nanocrystalline ribbon sheets that were heat treated and flake treated (Example 2), a magnetic field shield sheet using three nanocrystalline ribbon sheets that were heat treated and flake treated (Example 3), and a magnetic field shield sheet using four nanocrystalline ribbon sheets that were heat treated and flake treated (Example 3), were prepared respectively.

An amorphous alloy ribbon sheet applied for a shield sheet was prepared by comprising: making an amorphous ribbon made of a $Fe_{73.5}Cu_1Nb_3Si_{13.5}B_9$ alloy in a thickness of 25 μm by a rapid solidification method (RSP) due to melt spinning; cutting the amorphous ribbon in a sheet form and heat treating the cut sheet at 580° C., under no magnetic field, in a nitrogen (N2) atmosphere, for 1 hour, to thereby obtain the amorphous ribbon sheet; inserting the amorphous ribbon sheet between a protective film of 10 μm thick using a polyethylene terephthalate (PET) base member and a double-sided tape (with a release film excluded) of 10 μm thick using a PET base member, to thereby prepare a laminate sheet; and performing flake treatment and lamination treatment processes respectively by using a flake treatment processing device of FIG. 8 and a laminating device of FIG. 11. When two or more nanocrystalline ribbon sheets are laminated, acrylic adhesive layers of 12 μm formed on both sides of the PET film were used as double-sided tapes inserted between the nanocrystalline ribbon sheets.

To examine an influence upon a secondary coil when a prepared shield sheet was used in a wireless charger, a circular planar coil having an inductance of 12.2 pH and a resistance of 237 mΩ was used as a secondary coil bonded to the shield sheet, that is, as a measuring coil. Then, the measuring coil was connected to an LCR meter to measure the inductance (L), capacitance (C), and resistance (R), and then the LCR meter was located on the shield sheet. Then, a certain pressure was applied to the measuring coil by placing a rectangular parallelepiped having a weight of about 500 g on the measuring coil, and setting values of the LCR meter were set to be 100 kHz and 1 V. Then, inductance (Ls), magnetoresistance (Rs), impedance (Z), and coil quality factor (Q) were measured and represented in the following Table 1.

TABLE 1

| Ribbons tested | Number of ribbons | Ls (μH) | Rs (mΩ) | Z (Ω) | Q |
|---|---|---|---|---|---|
| Comparative Example 1 (No Sheet) | 0 | 12.08 | 245 | 7.59 | 30.9 |
| Comparative Example 2 (Non-heat treated ribbon) | 1 EA | 17.91 | 1020 | 11.3 | 11.03 |
| Comparative Example 3 (Heat treated ribbon) | 1 EA | 21.74 | 605 | 13.67 | 22.53 |
| Example 1 (Heat and flake treatment) | 1 EA | 21.52 | 442 | 13.52 | 30.5 |
| Example 2 (Heat and flake treatment) | 2 EA | 21.54 | 355 | 13.54 | 38 |
| Example 3 (Heat and flake treatment) | 3 EA | 21.56 | 327 | 13.55 | 41.4 |
| Example 4 (Heat and flake treatment) | 4 EA | 21.7 | 308 | 13.64 | 44.2 |

As can be seen from Table 1, in the case of a shield sheet using a ribbon which was not heat treated (Comparative Example 2), the magnetic permeability was low. Thus, since the inductance (Ls) of the secondary coil was small, and the electric resistance of the ribbon was low, the magnetoresistance (Rs) was large and the coil quality factor (Q) was remarkably low.

In the case of a shield sheet using a ribbon sheet which was heat treated (Comparative Example 3), the magnetic permeability was high. Thus, since the inductance (Ls) of the secondary coil was large, and the electric resistance of the ribbon sheet was high through nanocrystalline microstructures produced in the ribbon sheet by the heat treatment, the magnetoresistance (Rs) was greatly low when compared with before the heat treatment and thus the coil quality factor (Q) was greatly elevated when compared with before the heat treatment.

Further, in the case of a shield sheet using a ribbon sheet which was heat treated and flake treated (Example 1), since the inductance (Ls) of the secondary coil was not greatly changed, and the magnetoresistance (Rs) was greatly low when compared with when the flake treatment was not performed, the coil quality factor (Q) was greatly elevated.

Furthermore, when compared to Example 1, the higher the number of stacked sheets of the ribbon sheets may increase, the coil quality factor (Q) was greatly increased.

As described above, when the shield sheets according to the present invention are used in the wireless charger, the inductance (Ls) and the coil quality factor (Q) of the secondary coil is increased, and the magnetoresistance (Rs) is decreased. Accordingly, a transmission efficiency of the magnetic flux transmitted from the transmission device for the secondary coil for the wireless charger can be increased.

Examples 5-8 and Comparative Example 1

Power Transmission Efficiency of Magnetic Field Shield Sheets

The magnetic field shield sheets of Examples 5 to 7 were prepared into a rectangular shape in the same manner as in Examples 1 to 4. However, the number of nanocrystalline ribbon sheets laminated in the magnetic field shield sheets was changed into 6, 9, or 12. The magnetic field shield sheet of Example 8 was different from that of Example 6, in a point that the former was configured by making the shape of the latter (the number of nanocrystalline ribbon sheets was six) in the same annular shape as that of the secondary coil.

Figure 19:
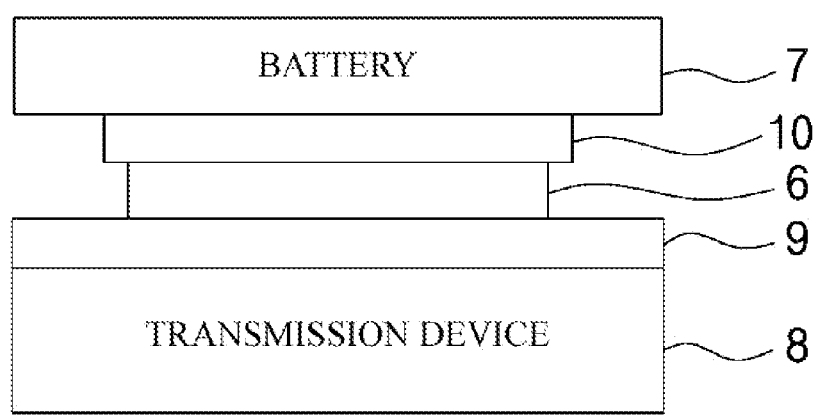
FIG. 19 is a schematic diagram showing a measuring structure for testing the efficiency and temperature characteristics of a magnetic field shield sheet according to the present invention.

Concerning Comparative Example 1 (in the case that no magnetic field shield sheet is used), and magnetic field shield sheets of Examples 5 to 8, respectively, as shown in FIG. 19, a separator sheet of paper 9 of 0.5 mm thick was placed on the upper portion of the transmission device 8 of the wireless charger, and then the magnetic field shield sheet 10 and the reception device with which the secondary coil 6 was assembled were placed on a lithium ion battery 7. In this state, voltage (V) and current (mA) applied to the primary coil of the transmission device 8, and voltage (V) and current (mA) applied to the secondary coil 6 of the reception device were measured and shown in the following Table 2, based on which the power transmission efficiency was calculated.

TABLE 2

| Ribbons tested | Transmission device V | Transmission device mA | Reception device V | Reception device mA | Efficiency (%) |
|---|---|---|---|---|---|
| Comparative Example 1 (No Sheet) | 19 | 188 | 4.87 | 520 | 70.895857 |
| Example 5 (six rectangular ribbons) | 19 | 205 | 4.87 | 521 | 65.141720 |
| Example 6 (nine rectangular ribbons) | 19 | 194 | 4.87 | 521 | 68.835323 |
| Example 7 (twelve rectangular ribbons) | 19 | 190 | 4.87 | 521 | 70.284488 |
| Example 8 (six coil-shaped ribbons) | 19 | 192 | 4.87 | 521 | 69.552357 |

In the case that a transmission device of a wireless charger employed a permanent magnet, according to the conventional art, a thickness of a shield sheet using a ferrite sheet due to a DC magnetic field of the permanent magnet should have been at least 0.5 T in order to perform an optimum wireless charging operation.

With reference to Table 2 above, as shown in Examples 5 to 7, in the case that the shield sheet, that is, the shape of the nanocrystalline ribbon sheet was rectangular, it could be seen that twelve or more nanocrystalline ribbon sheets were laminated in order to have substantially the same power transmission efficiency as that of the reception device of Comparative Example 1 having no shield sheet.

Further, in the case that twelve nanocrystalline ribbon sheets were used as in Example 7 of the present invention, permeability is high, and thus similar properties to the ferrite or the polymer sheet were obtained even at a thickness of 0.3 T lower than 0.5 T which was exhibited in the case of the conventional shield sheet using a ferrite sheet.

Further, in the case of making the shape of the magnetic field shield sheet (the number of nanocrystalline ribbon sheets was six) in the same annular shape as that of the secondary coil as in Example 8, it could be seen that substantially the same power transmission efficiency as that of Example 7 was exhibited even though the number of the nanocrystalline ribbon sheets used was ½ of Example 7 (the number of nanocrystalline ribbon sheets was twelve).

As a result, in the case of making the shape of the magnetic field shield sheet in the same annular shape as that of the secondary coil as in Example 8, the number of the nanocrystalline ribbon sheets used was reduced into ½, thereby lowering production costs, and further slimming thickness of products.

This result exhibited almost the same even though the shape of the secondary coil of the reception device and the shape of the magnetic field shield sheet corresponding to the shape of the secondary coil were changed into the different shapes.

Temperature characteristics

The magnetic field shield sheet according to Example 8 was set as shown in FIG. 19, and temperatures of the battery and the nanocrystalline ribbon sheet of the magnetic field shield sheet were measured in units of an interval of 30 minutes for the charging time from 30 minutes to 4 hours 30 minutes, and the results were shown in Table 3.

TABLE 3

| Charging time interval | Temperature of battery (° C.) | Temperature of ribbon sheet (° C.) |
|---|---|---|
| 0.5 hours | 29.5 | 30 |
| 1.0 hour | 30 | 30 |
| 1.5 hours | 30.5 | 30.5 |
| 2.0 hours | 30.5 | 30.5 |
| 2.5 hours | 30.5 | 31 |
| 3.0 hours | 30.5 | 31 |
| 3.5 hours | 30.5 | 31 |
| 4.0 hours | 30.5 | 31 |
| 4.5 hours | 30.5 | 31 |

In general, if a secondary battery such as a lithium ion battery 7 is over 40° C. when a wireless charging operation is made, safety problems may arise.

When the shield sheet of the present invention is applied for a wireless charger, as described in Table 3, the temperatures of the battery and the shield sheet did not rise even in the course of time, but maintained 30° C. or so. Thus, it could be seen that safety was ensured.

Example 9

An amorphous alloy ribbon sheet applied for a shield sheet was prepared by comprising: making an amorphous ribbon made of a $Fe_{67}B_{14}Si_1Co_{18}$ alloy in a thickness of 25 µm by a rapid solidification method (RSP) due to melt spinning; cutting the amorphous ribbon in a sheet form and heat treating the cut sheet at 487° C., 459° C., and 450° C., under no magnetic field, for 1 hour, respectively, to thereby obtain the amorphous ribbon sheet; inserting the amorphous ribbon sheet between a protective film of 10 µm thick using a polyethylene terephthalate (PET) base member and a double-sided tape (with a release film excluded) of 10 µm thick using a PET base member, to thereby prepare a laminate sheet; and performing flake treatment and lamination treatment processes respectively by using a flake treatment processing device of FIG. 8 and a laminating device of FIG. 11.

Here, one to nine nanocrystalline ribbon sheets to be used in a laminate sheet were laminated for heat treatment temperatures, and double-sided tapes were inserted between the amorphous ribbon sheets. The inductance (permeability) and the charging efficiency of each of the amorphous ribbon sheets for the heat treatment temperatures were measured and shown in Table 4.

TABLE 4

| Inductance (permeability) | Charging efficiency (%) | | | | | | | | |
|---|---|---|---|---|---|---|---|---|---|
| | 1 sheet | 2 sheets | 3 sheets | 4 sheets | 5 sheets | 6 sheets | 7 sheets | 8 sheets | 9 sheets |
| 13 µH | 56 | 61 | 65.6 | 65.8 | 67.1 | 68.4 | 68.9 | 69.1 | Inoperable |
| 15 µH | 59.2 | 65.8 | 68 | 68.4 | 68.6 | 69.1 | 69.1 | 69.3 | 68.9 |
| 18 µH | 57 | 63.6 | 66.3 | 68 | 68.2 | 68.9 | 69.1 | 69.1 | 68.9 |

In the result of heat treating each amorphous ribbon sheet at 487° C., 459° C., and 450° C. for one hour under no magnetic field, the inductance (permeability) of each sheet was decreased into 13 μH, 15 μH, 18 μH with the increase in the heat treatment temperature.

The charging efficiency for the inductance of each sheet was the highest in the case that the inductance (permeability) of the sheet that was heat treated at 459° C. was 15 pH. As the number of laminated amorphous ribbon sheets was increased from one to eight, the charging efficiency was also increased proportionally with the number of the sheets. In the case that about 4 sheets were laminated, a saturation phenomenon occurred, and in the case of exceeding eight sheets, the charging efficiency was decreased.

Example 10

The maximum charging efficiency of the laminated sheets for the number of laminated sheets was measured by using the amorphous ribbon sheet of the inductance (permeability) of 15 μH, and the results were shown in Table 5.

The maximum charging efficiency was obtained in the state where value of a time constant of the reception device was adjusted to make the efficiency set to a maximum value based on value of the inductance of the reception device of the wireless charger, that is, the secondary coil.

TABLE 5

| | Maximum charging efficiency (%) | | | |
|---|---|---|---|---|
| Permeability | 1 sheet | 2 sheets | 3 sheets | 4 sheets |
| 15 μH | 61.3 | 68.7 | 71.1 | 71.9 |

Referring to Table 5, the efficiency was increased according to the number of laminated amorphous ribbon sheets, and the maximum charging efficiency was 71.9% in the highest in the case of four sheets.

As described above, the present invention greatly reduces a loss due to eddy currents by a flake treatment process of an amorphous ribbon, to thereby block an effect of a magnetic field influencing upon a main body and a battery of a portable mobile terminal device and simultaneously to increase a quality factor (Q) of a secondary coil, and to thus exhibit excellent electric power transmission efficiency.

In addition, the present invention fills a gap between fine pieces of an amorphous ribbon through a flake treatment process of the amorphous ribbon and then a compression laminating process with an adhesive, to thereby prevent water penetration, and simultaneously surrounds all surfaces of the fine pieces with an adhesive (or a dielectric) to thus mutually isolate the fine pieces to thereby promote reduction of eddy currents and prevent shielding performance from falling.

Moreover, the present invention establishes a shape of a shield sheet into a shape similar to that of a coil of a receiving device for a wireless charger, to thereby exhibit a high power transmission efficiency or equal power transmission efficiency while lowering thickness of the magnetic field shield sheet to be equal to or less than 0.3 mm, even though a small number of nanocrystalline ribbons are used.

In addition, the present invention sequentially performs a flake treatment process and a laminating process by using a roll-to-roll method, to thereby achieve a sheet molding process to thus maintain original thickness of the sheet and to thus exhibit high productivity and inexpensive manufacturing costs.

The embodiments of the present invention have been described with respect to the case that a wireless charger is applied to a portable terminal device, but it is apparent to one of ordinary skill in the art that the present invention can be applied to all portable terminal devices providing a wireless charging function in a non-contact (wireless) manner.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

INDUSTRIAL APPLICABILITY

A magnetic field shield sheet for a wireless charger according to the present invention may be applied to a variety of portable electronic devices including a portable terminal device, to thereby block an influence upon the portable terminal device by AC and DC magnetic fields that are generated when a wireless charging function is implemented in a non-contact (wireless) manner, and to thereby assist the magnetic field shield sheet for a wireless charger to absorb electromagnetic waves necessary for the wireless charging function.

The invention claimed is:

1. A magnetic field shield sheet for a wireless charger, the magnetic field shield sheet comprising:
   a thin magnetic sheet separated into a plurality of fine pieces; and
   an adhesive member adhered on one surface of the thin magnetic sheet such that the adhesive member is adhered to the plurality of fine pieces;
   wherein the plurality of fine pieces comprises fine pieces having different sizes with each other of several tens of gm to 3 mm.

2. The magnetic field shield sheet for a wireless charger of claim 1, wherein the adhesive member is a double-sided tape, and at least parts of gaps among the plurality of fine pieces are filled by an adhesive layer of the double-sided tape.

3. The magnetic field shield sheet for a wireless charger of claim 1, wherein the adhesive member is a no-base type tape, the thin magnetic sheet is adhered on one surface of the adhesive member, and a release film is separably adhered on the other surface of the adhesive member.

4. The magnetic field shield sheet for a wireless charger of claim 1, further comprising a protective member adhered on the other surface of the thin magnetic sheet.

5. The magnetic field shield sheet for a wireless charger of claim 1, wherein a thin ribbon made of an amorphous alloy or nanocrystalline alloy is used as the thin magnetic sheet.

6. The magnetic field shield sheet for a wireless charger of claim 1, wherein the magnetic field shield sheet is applied to a reception device of a wireless charger having a permanent magnet in a transmission device, and wherein the thin magnetic sheet comprises 2 to 8 layers of laminated sheets made of a Fe-based amorphous alloy, and an adhesive layer is inserted among the laminated sheets.

7. The magnetic field shield sheet for a wireless charger of claim 1, wherein the magnetic field shield sheet is applied to a reception device of a wireless charger having a permanent magnet in a transmission device, and wherein the thin magnetic sheet comprises 4 to 12 layers of laminated sheets made of a nanocrystalline alloy, and an adhesive layer is inserted among the laminated sheets.

8. The magnetic field shield sheet for a wireless charger of claim 1, wherein the magnetic field shield sheet is applied to a reception device of a wireless charger having no permanent magnet in a transmission device, and wherein the thin magnetic sheet comprises 2 to 4 layers of laminated sheets made of a Fe-based amorphous alloy or a nanocrystalline alloy, and an adhesive layer is inserted among the laminated sheets.

9. The magnetic field shield sheet for a wireless charger of claim 1, wherein the magnetic field shield sheet is formed of a shape corresponding to a secondary coil provided on the reception device of the wireless charger.

10. A reception device for a wireless charger that charges a secondary battery from a transmission device for the wireless charger, the reception device comprising:

a coil unit that receives a wireless signal transmitted from the transmission device; and a magnetic field shield sheet that is disposed between the coil unit and the secondary battery, wherein the magnetic field shield sheet comprises:

a thin magnetic sheet separated into a plurality of fine pieces; and an adhesive member adhered on one surface of the thin magnetic sheet such that the adhesive member is adhered to the plurality of fine pieces;

wherein the plurality of fine pieces comprises fine pieces having different sizes with each other of several tens of μm to 3 mm.

11. The reception device for a wireless charger of claim 10, wherein the coil unit and an antenna coil for near field communications (NFC) are formed on a single substrate.

* * * * *